Figure 1:
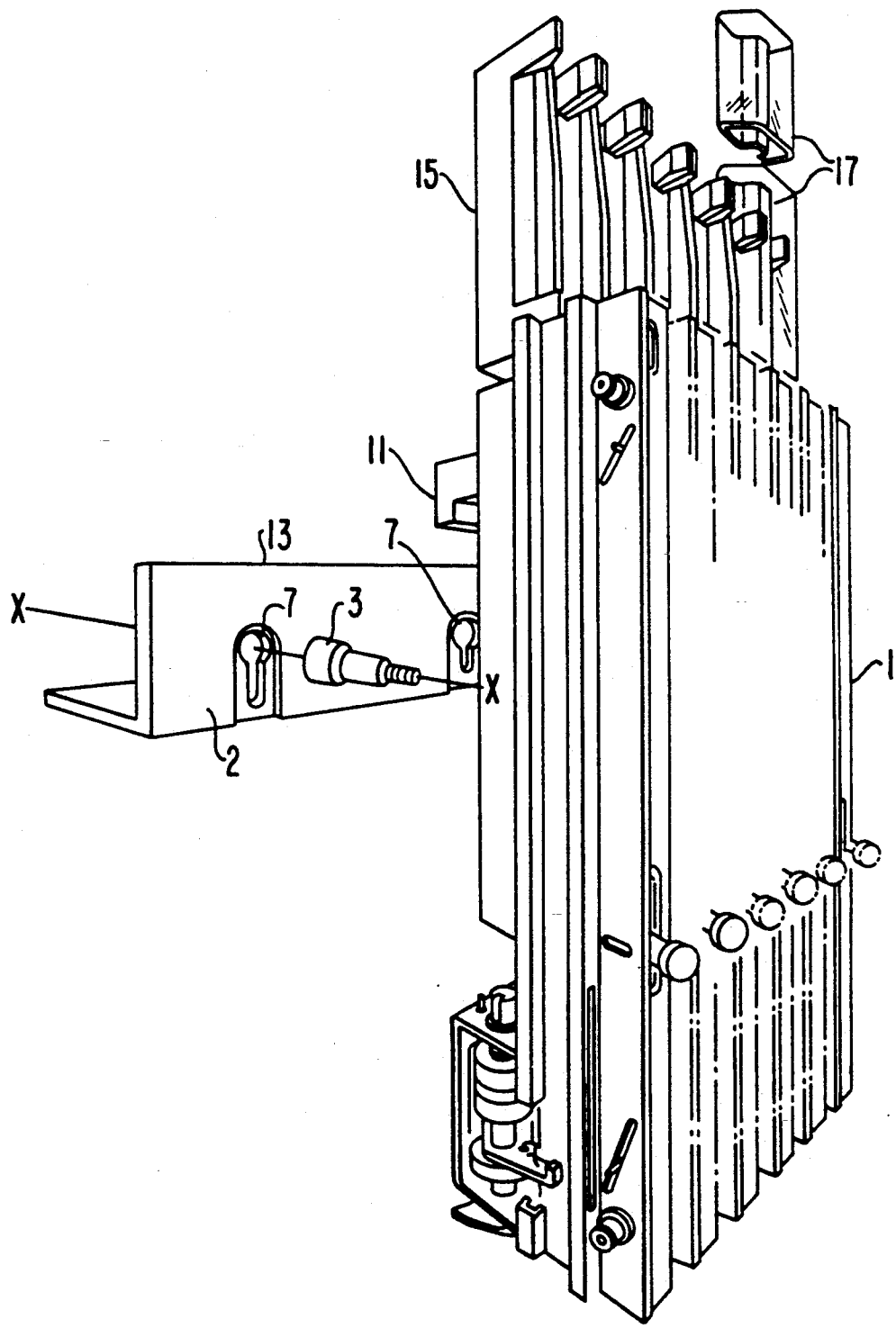

United States Patent [19]

Babington

[11] Patent Number: 5,077,890
[45] Date of Patent: Jan. 7, 1992

[54] 0.3 UNIMODULE OFFLINE LOADING TROLLEY AND METHOD OF USING

[75] Inventor: David J. Babington, Gwent, United Kingdom

[73] Assignee: Mitel Telecom Limited, England

[21] Appl. No.: 444,302

[22] Filed: Dec. 1, 1989

[51] Int. Cl.⁵ .................. H05K 3/30; G07F 11/12
[52] U.S. Cl. ........................ 29/832; 221/11;
 221/125; 221/130; 221/131; 29/739; 29/759;
 29/809; 206/332; 414/414
[58] Field of Search .............. 29/739, 741, 809, 124,
 29/759; 221/125, 130, 131, 289, 298, 312 B, 312
 C, 281, 21, 197; 914/403, 404, 797.4; 206/332;
 414/414

[56] References Cited

U.S. PATENT DOCUMENTS

| | | | |
|---|---|---|---|
| 3,760,484 | 9/1973 | Kowalski | 29/809 X |
| 4,169,541 | 10/1979 | Ragard et al. | 221/281 |
| 4,222,166 | 9/1980 | Kurek et al. | 29/741 X |
| 4,500,246 | 2/1985 | Janisiewicz | 414/414 |
| 4,586,251 | 5/1986 | Kinoshita et al. | 29/741 |
| 4,763,811 | 8/1988 | Mae et al. | 414/403 X |
| 4,831,696 | 5/1989 | Elliott et al. | 221/197 X |
| 4,860,903 | 8/1989 | Jennings et al. | 29/809 X |
| 4,873,762 | 10/1989 | Elliott et al. | 221/197 X |

*Primary Examiner*—Carl J. Arbes
*Attorney, Agent, or Firm*—Antonelli, Terry, Stout & Kraus

[57] ABSTRACT

A method of preparing electronic components for insertion into printed circuit boards by means of an automatic insertion machine which has an attached set of component retaining and dispensing magazines, comprising the steps of loading another set of magazines at a position detached from the automatic insertion machine while the machine is in operation, then shutting down the machine and swapping the loaded set of magazines for the set previously attached to the machine, and restarting the machine.

6 Claims, 3 Drawing Sheets

0.3 UNIMODULE OFFLINE LOADING TROLLEY AND METHOD OF USING

This invention relates to a method and apparatus for use in handling magazines which are designed to carry items used in manufacture. The invention has particular, but not exclusive, application to printed circuit board production and it may be used to improve the production capacity of a machine that inserts electronic integrated circuits into printed circuit boards.

Modern-day electronic device manufacture utilizes mechanization as a means of maximizing production capacity. To this end, electronic integrated circuits are automatically inserted into printed circuit boards by a machine known as an auto-insertion machine. An example of such a machine is the UNIMOD TM auto-insertion machine, manufactured by Universal Instrument Corp. Inc.

An auto-insertion machine typically includes one or more magazines which can be engaged to and from the auto-insertion machine. Each magazine engaged to the auto-insertion machine can contain a plurality of electronic integrated circuits that are to be automatically inserted into one or more printed circuit boards during auto-insertion machine operation, under program control.

The magazines are initially loaded with the integrated circuits that are to be inserted at predetermined locations on a printed circuit board. Magazines are required to be loaded again with electronic integrated circuits when one or more of the magazines become empty or when the auto-insertion machine finishes filling a first type of printed circuit board and must fill a second type of printed circuit board requiring a different mix of electronic integrated circuits. Magazines that have been emptied and are required to be loaded with electronic integrated circuits are denoted as spent magazines.

The auto-insertion machine must be shut down in order to allow manual loading of spent magazines, or magazines that are to be emptied and reloaded with a different mix of integrated circuits. A typical time period incurred for manual loading of spent magazines of the UNIMOD auto-insertion machine is about 35 minutes. The substantial amount of down time during which the auto-insertion machine is not in operation occurring during the loading of spent magazines reduces the production capacity of the auto-insertion machine.

An operator loading spent magazines during a time period in which the auto-insertion machine is not in operation must load quickly in order for the auto-insertion machine to once again become operational, to maximize the productivity of the machine. As a result, operator error and operator fatigue increases, resulting in increased numbers of faulty printed circuit boards.

The present invention enables an operator to preload a complete set of separate magazines off line, while the auto-insertion machine is in operation. The operator then swaps the complete set of spent magazines or set of magazines to be changed to a different mix, with the preloaded magazines. Accordingly, operator error and operator fatigue decreases since he or she can pre-load the magazines at a reasonable and unstressed rate. The result is increased yield of correctly filled printed circuit boards.

Since the machine does not have to be stopped to fill the magazines, productivity of the machine is maximized. The machine need only be stopped to exchange sets of magazines, which takes only a few moments.

In one embodiment of the invention there is provided a trolley for maximizing the production capacity of an auto-insertion machine. The auto-insertion machine is comprised of one or more magazines releasably engaged to the trolley. Each magazine contains a plurality of electronic integrated circuits which during machine operation are automatically inserted into successive printed circuit boards. The trolley is comprised of a wheeled chassis, an elevated frame carried by the chassis, and means releasably engaging a set of magazines to the elevated frame. The trolley is operated by an operator who loads one or more magazines engaged to the frame during a time period in which the auto-insertion machine is in operation, using a previously loaded set of magazines. A set of spent magazines engaged to the auto-insertion machine is exchanged for the set of loaded magazines engaged to the frame during a short machine shut down time period, thereby maximizing the productivity of the auto-insertion machine.

The term "set of magazines" is intended to denote a cluster of magazines fixed together, all facing the same direction.

A preferred method of operating one embodiment of the invention includes preparing electronic components for insertion into printed circuit boards by means of an automatic insertion machine which has an attached set of component retaining and dispensing magazines. The method comprises the steps of loading another set of magazines at a position detached from the automatic insertion machine while the machine is in operation, then shutting down the machine and swapping the loaded set of magazines for the set previously attached to the machine, and restarting the machine.

One embodiment of the invention to be described includes apparatus for preparing a set of loaded magazines for use with an automatic insertion machine comprising a pair of pins extending orthogonally outward from the set of magazines, a horizontal rail containing spaced keyhole slots for retaining the pins, a horizontal rail steady attached to the set of magazines disposed in a position for fitting over the rail, for removably fixing the set of magazines to the rail, apparatus for supporting the rail at an elevated position whereby an operator can fill the magazines, and apparatus for facilitating moving the supporting apparatus from the machine to a magazine loading position.

Figure 2:
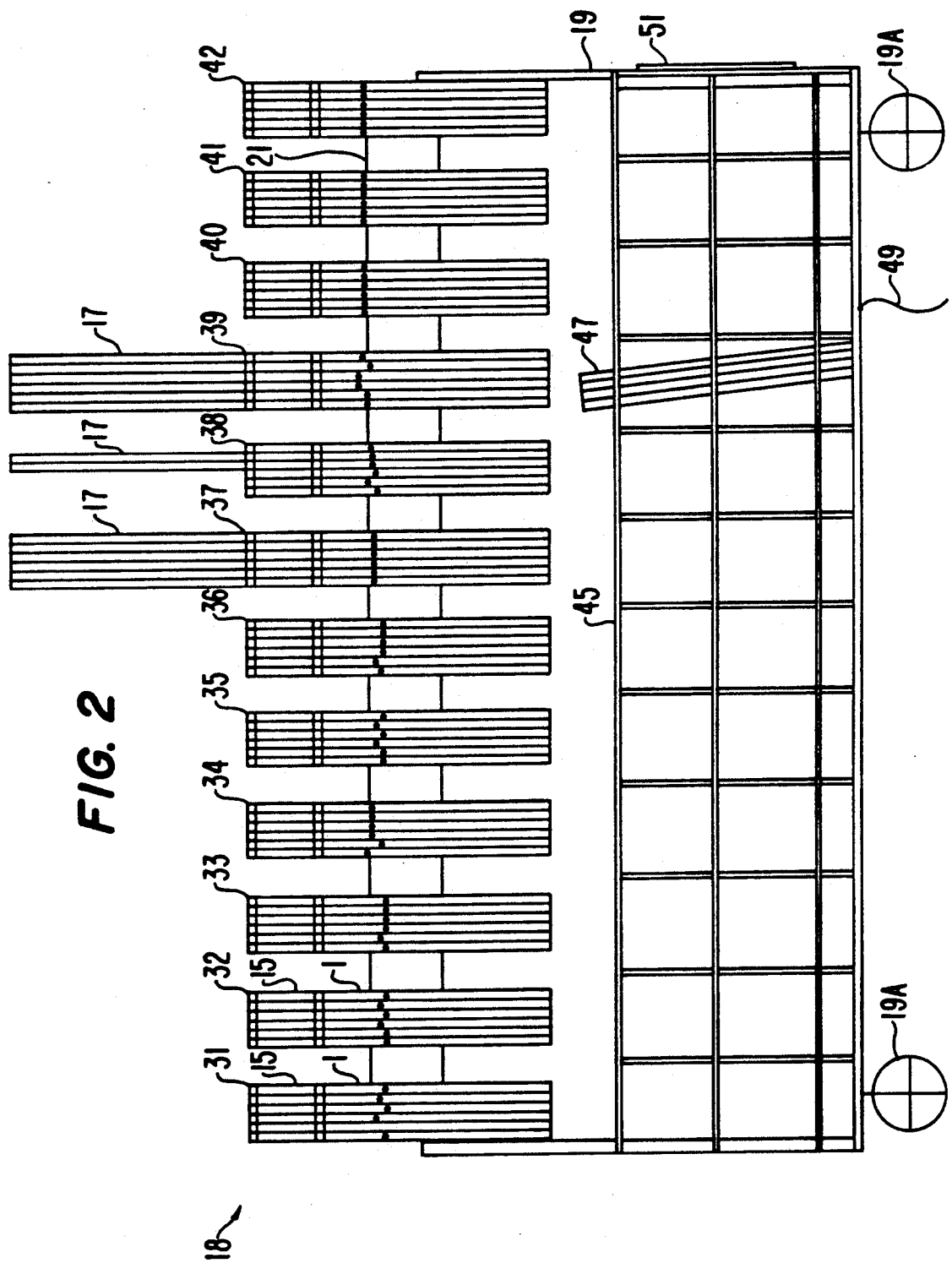
Figure 3:
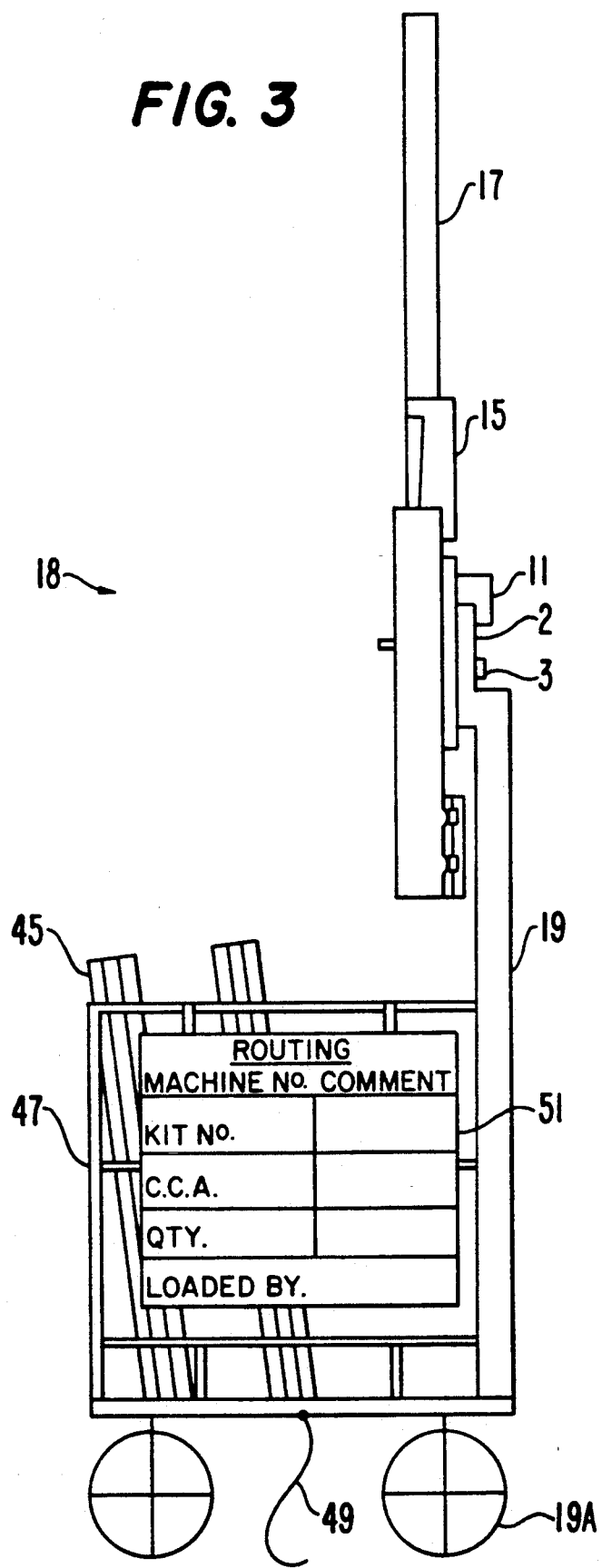

A better understanding of the present invention will be obtained from the following description which is given by way of example and with reference to the accompanying drawings, in which:

FIG. 1 is a perspective view of a preferred embodiment of the present invention, FIG. 2 is a front view of the preferred embodiment, and FIG. 3 is a side view of the preferred embodiment.

FIG. 1 illustrates a magazine 1 of a type used on the UNIMOD auto-insertion machine. The magazine is releasably engaged to a rail 2, which is mounted on an elevated position on a wheeled chassis 19 (FIGS. 2 and 3). The magazine is comprised of a pair of magazine locating pins 3, one shown exploded and extending outwardly of the magazine and located on an axis X-X orthogonal to the back side of the magazine, the X-X axes being spaced and located adjacent opposite sides of the machine. A grooved or L cross section shaped member 11 operating as a magazine rail steady is fixed to and is disposed along the back side of the magazine. The magazine locating spigots 3 extend through corresponding keyhole slots 7 in the rail 2, and the magazine rail steady 11 extends downwardly over a top edge 13 of the rail 2, supporting the magazine with the pins. The pins and keyholes releasably engage the magazine to and from the rail.

The magazine 1 is comprised of magazine clip 15 for releasably engaging one or more tubes 17, each for containing a plurality of electronic integrated circuits. The electronic integrated circuits are loaded into the magazine 1 from the tubes by an operator. The tubes are held by the magazine clip 15, and upon removing end stoppers from the tubes the integrated circuits slide out of the tubes and into the magazines.

FIGS. 2 and 3 (not to scale) illustrate the front and side views of the preferred embodiment of the trolley 18 of the present invention. A chassis 19 supported on wheels 19A supports an elevated elongated rail 21, corresponding to rail 2 of FIG. 1. The elongated rail 21 is comprised of a plurality of keyhole slots disposed along the lengthwise face of the elongated rail 21 (as shown in FIG. 1). Each pair of keyhole slots holds a corresponding magazine 31-42. The wheeled chassis 19 preferably further supports a plurality of storage cells 45 for the storage of tubes 47.

An anti-static metallic tail 49 in the form of a wire or chain having a length sufficient to touch the floor is connected to the bottom of the trolley to discharge electrostatic charges from the trolley 18 and magazine 31-42 to the floor.

One or more of the magazines 31-42 are loaded by an operator, during a time in which the auto-insertion machine is in operation, using an empty set of magazines. The loading may be accomplished in any area suitable for such a purpose. Magazines are loaded in the loading area independent of auto-insertion machine operation, and transported to the auto-insertion machine when required by moving the trolley. Loading of the auto-insertion machine with electronic integrated circuits is effected by the operator merely swapping spent magazines engaged to the machine for the preloaded magazines, after shutting down the machine. The output capacity of the auto-insertion machine is maximized for the reason that the manual magazine loading that takes a long interval is accomplished while the machine is in operation. The time period during which the auto-insertion machine remains idle is minimized, since it only involves swapping of magazines, not loading of magazines.

The embodiment described can be made to suit a variety of auto-insertion machines by tailoring the elevated elongated rail 21 for releasably engaging respective magazines of different machines to and from the trolley. The present invention is not limited to loading magazines. The arrangement described can be used as a magazine serving support and for the inspection and the repair of magazines.

It will be understood that the invention has been described by way of example with reference to a particular embodiment and that variations and modifications may be made within the scope of the appended claims given a purposive construction.

For example the method may include the steps of handling magazines that are designed to carry articles other than those described above, that articles may be loaded into a number of first magazines which are then loaded into a machine and that a number of second magazines may be loaded with further articles while the machine is operating on the articles from the first magazines, and that the first magazines may be removed when empty and be replaced by the loaded second magazines. The ability to remove all of the first magazines in one operation and replace them in a second operation by the second loaded magazines contributes to the efficiency of the method.

It will also be understood that the apparatus may be used with other articles than those described and that the apparatus may include a number of first magazines for carrying articles to be used in the process, first support means for carrying the number of first magazines to the machine in such a way that they cooperate with the machine to feed articles to the machine, a number of second magazines for carrying further articles to be used in the process, and second support means for carrying the number of second magazines to the machine in such a way that they cooperate with the machine to feed the further articles to the machine upon the removal of the first support means and the first magazines from cooperation with the machine.

I claim:

1. A method of preparing electronic components for insertion into printed circuit boards by means of an automatic insertion machine which has an attached set of component retaining and dispensing magazines, comprising the steps of hanging another set of magazines on a trolley which is movable between said machine and a position detached from said machine, loading said another set of magazines at said detached position while said machine is in operation, then shutting down said machine and swapping the loaded set of magazines for the set previously attached to the machine, and restarting the machine.

2. A method of manufacture which involves handling magazines that are designed to carry articles to be used in a machine including the steps of loading a set of first magazines with the articles, loading the machine with the loaded set of first magazines, releasably engaging a set of second magazines to a support means which is movable between said machine and a position detached from said machine, loading said set of second magazines with further of the articles at said detached position while the machine is operating on the articles from the set of the first magazines, removing the set of first magazines from the machine and replacing them by the set of loaded second magazines.

3. Means for preparing a set of loaded magazines for use with an automatic insertion machine comprising a pair of pins extending orthogonally outward from the set of magazines, a horizontal rail fixed to the machine containing spaced keyhole slots for retaining the pins, a horizontal rail steady attached to and fixing the set of magazines together for fitting over the rail allowing the pins to fit into said slots whereby the set of magazines can be removably fixed to the rail, means separate from the machine for supporting the rail steady at a position whereby an operator can fill the magazines removed from the machine, and means for facilitating moving the supporting means from said machine to a magazine loading position.

4. Means as defined in claim 3 in which the rail supporting means and the means for facilitating moving is comprised of a wheeled chassis.

5. Means as defined in claim 3 further including conducting means connected to the bottom of the chassis and touching a floor, for providing an electrostatic discharge path from the chassis to the floor.

6. Apparatus for use in a manufacturing process which employs a machine adapted to be loaded with articles for use in the process, the apparatus including a number of first magazines for carrying articles to be used in the process, first support means for releasably engaging the number of first magazines together, and for carrying the number of first magazines together from a position detached from the machine to the machine in such a way that they cooperate with the machine to feed articles to the machine, a number of second magazines for carrying further articles to be used in the process, and second support means for releasably engaging the number of second magazines together and for carrying the number of second magazines together from a position detached from the machine to the machine in such a way that they cooperate with the machine to feed the further articles to the machine upon the removal of the first support means and the first magazines from cooperation with the machine.

* * * * *